United States Patent
Lim et al.

(10) Patent No.: US 7,281,179 B2
(45) Date of Patent: Oct. 9, 2007

(54) MEMORY DEVICE AND INPUT SIGNAL CONTROL METHOD OF A MEMORY DEVICE

(75) Inventors: Sang-Gyu Lim, Suwon-si (KR); Sung-Bum Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 130 days.

(21) Appl. No.: 10/975,006

(22) Filed: Oct. 28, 2004

(65) Prior Publication Data

US 2005/0097410 A1    May 5, 2005

(30) Foreign Application Priority Data

Oct. 30, 2003    (KR)    ........................ 10-2003-0076215

(51) Int. Cl.
G11C 29/00    (2006.01)
G01R 31/28    (2006.01)

(52) U.S. Cl. ................ 714/718; 714/724; 714/730

(58) Field of Classification Search ................ 714/718, 714/724
See application file for complete search history.

(56) References Cited

U.S. PATENT DOCUMENTS

| | | | |
|---|---|---|---|
| 5,815,100 A | | 9/1998 | Rush et al. |
| 6,058,056 A | * | 5/2000 | Beffa et al. ................ 365/201 |
| 6,157,999 A | | 12/2000 | Rossbach et al. |
| 6,353,903 B1 | * | 3/2002 | Adams et al. .............. 714/724 |
| 6,438,720 B1 | * | 8/2002 | Boutaud et al. ............ 714/724 |
| 6,457,148 B1 | | 9/2002 | Yoshiba |
| 6,510,530 B1 | * | 1/2003 | Wu et al. .................... 714/30 |
| 6,535,993 B1 | | 3/2003 | Hamada et al. |
| 6,759,753 B2 | | 7/2004 | Chao |
| 6,812,726 B1 | | 11/2004 | Ong |
| 7,007,215 B2 | * | 2/2006 | Kinoshita et al. .......... 714/745 |
| 7,028,236 B2 | | 4/2006 | Okazaki |
| 2001/0013110 A1 | * | 8/2001 | Pierce et al. ............... 714/718 |
| 2002/0078408 A1 | | 6/2002 | Chambers et al. |
| 2002/0087790 A1 | | 7/2002 | Barth et al. |

(Continued)

FOREIGN PATENT DOCUMENTS

JP    6-77792    3/1994

(Continued)

Primary Examiner—Guy Lamarre
Assistant Examiner—Saqib J. Siddiqui
(74) Attorney, Agent, or Firm—Volentine & Whitt, PLLC

(57) ABSTRACT

A memory device and a method of controlling an input signal of the memory device. In the method of controlling an input signal according to test modes, it is determined whether the input signal is in a first test mode or a second test mode. If the memory device is in the first test mode, in response to a control signal, an input signal is received through input pins. In response to a mode signal, the input signal is separated into data and an address. The separated data and address is applied to the core of a memory device. If the memory device is in the second test mode, an input signal is received through input pins and inverting input pins. In response to a mode signal, an address is separated from the input signal received through the input pins and the data is separated from the input signal received through the inverting input pins. The separated data and address are applied to the core of a memory device.

24 Claims, 5 Drawing Sheets

U.S. PATENT DOCUMENTS

| | | |
|---|---|---|
| 2002/0138797 A1 | 9/2002 | Beaujoin et al. |
| 2002/0172085 A1 | 11/2002 | Feurle |
| 2003/0198115 A1 | 10/2003 | Schaefer et al. |
| 2003/0237033 A1 | 12/2003 | Borri et al. |
| 2004/0022088 A1 | 2/2004 | Schaefer |
| 2004/0133827 A1 | 7/2004 | Norris et al. |
| 2004/0252689 A1 | 12/2004 | Park et al. |
| 2005/0094631 A1 | 5/2005 | Park et al. |

FOREIGN PATENT DOCUMENTS

| | | |
|---|---|---|
| KR | 10-2001-0063390 | 4/2002 |
| KR | 1020040106198 A | 12/2004 |

* cited by examiner

FIRST TEST MODE

SECOND TEST MODE

MEMORY DEVICE AND INPUT SIGNAL CONTROL METHOD OF A MEMORY DEVICE

BACKGROUND OF THE INVENTION

1. Field of the Invention

Embodiments of the present invention relate to a memory device or a method of controlling input signals input into a memory device. In embodiments, separation of data and addresses from input signals is controlled. This application claims the priority of Korean Patent Application No. 2003-76215, filed on Oct. 30, 2003, in the Korean Intellectual Property Office, the disclosure of which is incorporated herein in its entirety.

2. Description of the Related Art

Through the development of input/output (I/O) interface technology, a variety of I/O interface technologies have been adopted in memory devices. Such I/O interface technologies include differential signaling technology. In differential signaling technology, a pair of input signals having opposite phases are input into a memory device.

Compared to single-ended signaling technology (where a reference signal and an input signal are applied to a memory device), differential signaling technology can improve signal margin and decrease noise. However, differential signaling technology requires twice as many I/O pins compared to single-ended signaling technology. Even if a memory device usually has a high operating frequency, memory cells and cores are tested using a tester at a low operating frequency in a test mode. Further, in each stage of a test (e.g. a wafer test, a monitor burn-in test (MBT), and a package test), a method of inputting data and addresses to test memory cells and cores are different. In other words, while both the data and the address may be input through one input pin in the wafer test stage, the data and the address may be input through separate input pins in the MBT stage or the package stage.

Due to the limited number of pins and a complex design, memory devices that use single-ended signaling technology may be limited to either a first test mode (in which data and addresses are input through one pin) or a second test mode (in which data and addresses are inputted separately).

SUMMARY OF THE INVENTION

Embodiments of the present invention relate to a method of controlling input signals according to test modes using a memory device configured for differential signaling technology that has twice as many input/output (I/O) pins as single-ended signaling technology. Embodiments of the present invention relate to a memory device adopting differential signaling technology (that have twice as many I/O pins to control input signals) according to test modes.

According to embodiments of the present invention, a method controls an input signal of a memory device according to the test modes. The method includes deciding whether the input signal is in a first test mode or a second test mode. If the input signal is in the first test mode, the method responds to the control signal receiving the input signal through input pins, responds to all signals by separating the input signal into data and addresses, and applies the separated data and address to the core of a memory device. If the input signal is in the second test mode, the method responds to the control signal receiving the input signal through input pins and inverting input pins, responds to a mode signal by separating addresses from the input signal received through the input pins, separates data from the input signal received through the inverting input pins, and applies the separated data and address to the core of a memory device.

When separating the data and the address from the input signal in the first test mode, the data is separated from the input signal when the mode signal is activated and the address is separated from the input signal when the mode signal is deactivated. Separating the data and the address from the input signal in the second test mode, the data is separated from the input signal received through the inverting input pins when the mode is activated and the address is separated from the input signal received through the input pins when the mode signal is deactivated.

In the first test mode, the control signal may be at a first level and in the second test mode the control signal may be at a second level. The first test mode may be a wafer test stage, while the second test mode may be a monitor burn-in test (MBT) stage or a package test stage. The memory device has a structure where input pins and inverting input pins form a pair.

According to embodiments of the present invention, a memory device includes input pins, corresponding inverting input pins, a control unit, and a separation unit. The control unit responds to a control signal and either transmits or blocks input signals applied to the input pins and/or the inverting input pins. The separation unit receives input signals that are output from the control unit, responds to the mode signal separating data and an address from the input signal, and applies them to a memory core.

The separation unit may include a bus interface logic and addresses separation unit. The bus interface logic separates data from an input signal and applies it to a memory core. The addresses separation unit responds to the mode signal and separates addresses from the input signal and applies the addresses to a memory core. In the separation unit, when the mode signal is activated, the data is separated from the input signal. When the mode signal is deactivated, the address is separated.

The control unit may include a first transmission unit and a second transmission unit. In response to a control signal, the first transmission unit either connects or disconnects an input pin and a bus interface logic. In response to an inverse control signal, the second transmission unit either connects or disconnects an inverting input pin and a bus interface logic. The input pins and the address separation unit are connected. If the control signal is at a first level, the first transmission unit connects the input pin and the bus interface logic. If the inverse control signal is at a first level, the second transmission unit connects the inverting input pin and the bus interface logic. The first transmission unit and the second transmission unit may be a switch or a transmission gate. In embodiments, the control signal is a mode register set (MRS) signal. When the control signal corresponds to a wafer test stage, the control signal is at a first level. Likewise, the control signal at a MBT or a package test stage, the control signal is at a second level. The memory device may include a test control logic which produces mode signals.

According to embodiments of the present invention, a method controls input signals of a memory device for each of the test modes. The method includes, receiving input signals through input pins and inverting input pins. In response to control signals, the method either transmits or blocks the input signals output from the input pins and the inverting input pins. In response to the mode signal, the method separates the data and the address from the input signal. The method applies the separated data and address to the memory core.

BRIEF DESCRIPTION OF THE DRAWINGS

Example

Example

Example

Example

Example

Example

Example

DETAILED DESCRIPTION OF EMBODIMENTS OF THE INVENTION

Figure 1:
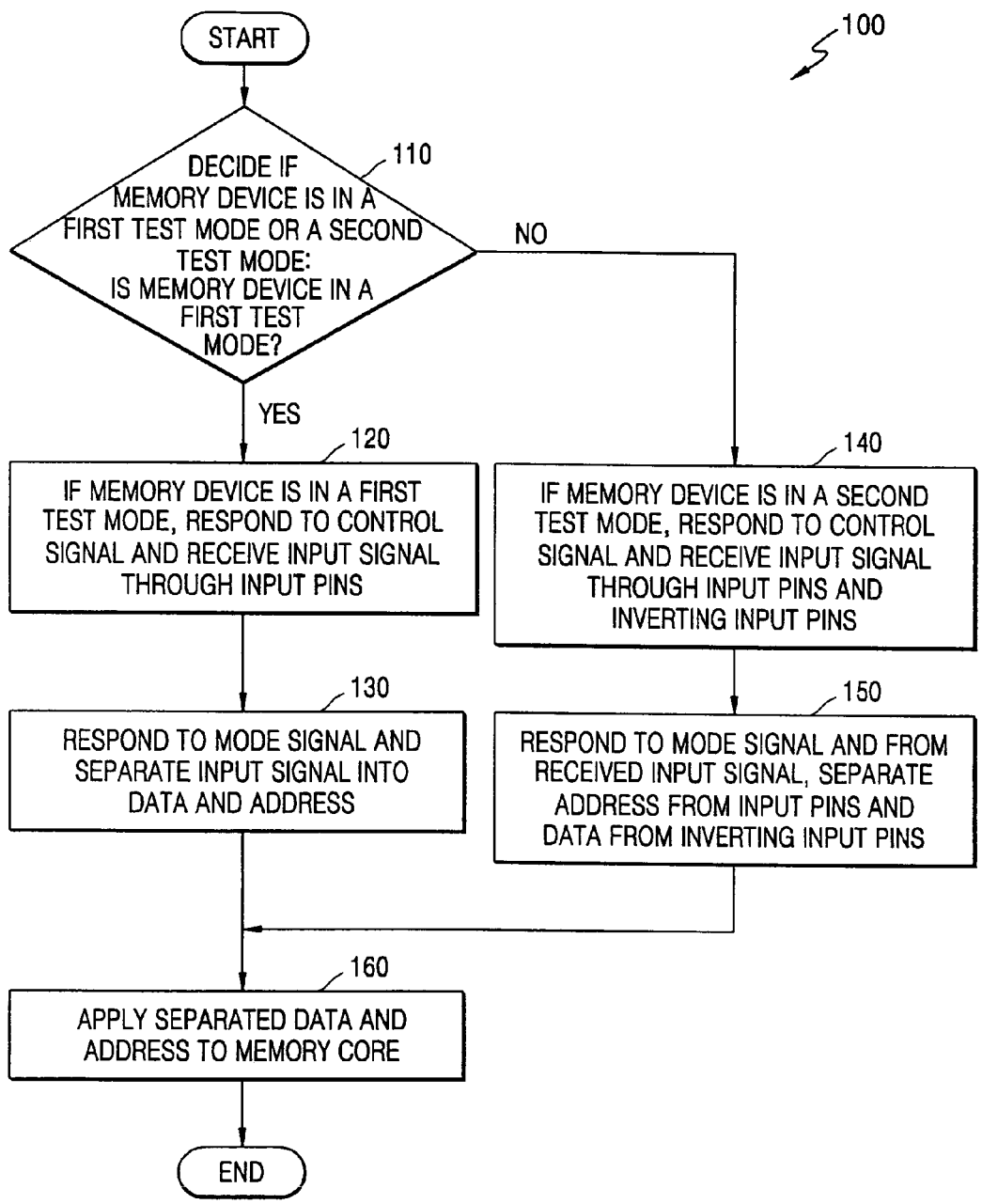
FIG. 1 is a flow chart illustrating controlling of an input signal of a memory device for each test mode, according to embodiments of the present invention.

Example FIG. 1 is a flow chart illustrating a method of controlling an input signal of a memory device for each test mode, according to embodiments of the present invention. Method 100 controls input signals of a memory device for each test mode. In Step 110, it is determined whether the memory device is in a first test mode or a second test mode. In Step 120, in response to a control signal, if the memory device is in the first test mode, the input signal is received through input pins. In Step 130, in response to a mode signal, the input signal is separated into data and an address. In Step 160, the separated input signals are applied to the core of a memory device. In Step 140, if the memory device is in the second test mode, in response to a control signal, the input signal is received at input pins and inverting input pins. In Step 150, in response to a mode signal, addresses from input signals received through input pins are separated and data from the input signals received through inverting input pins are separated. In Step 160, the separated data and address are applied to the core of the memory device.

Figure 2:
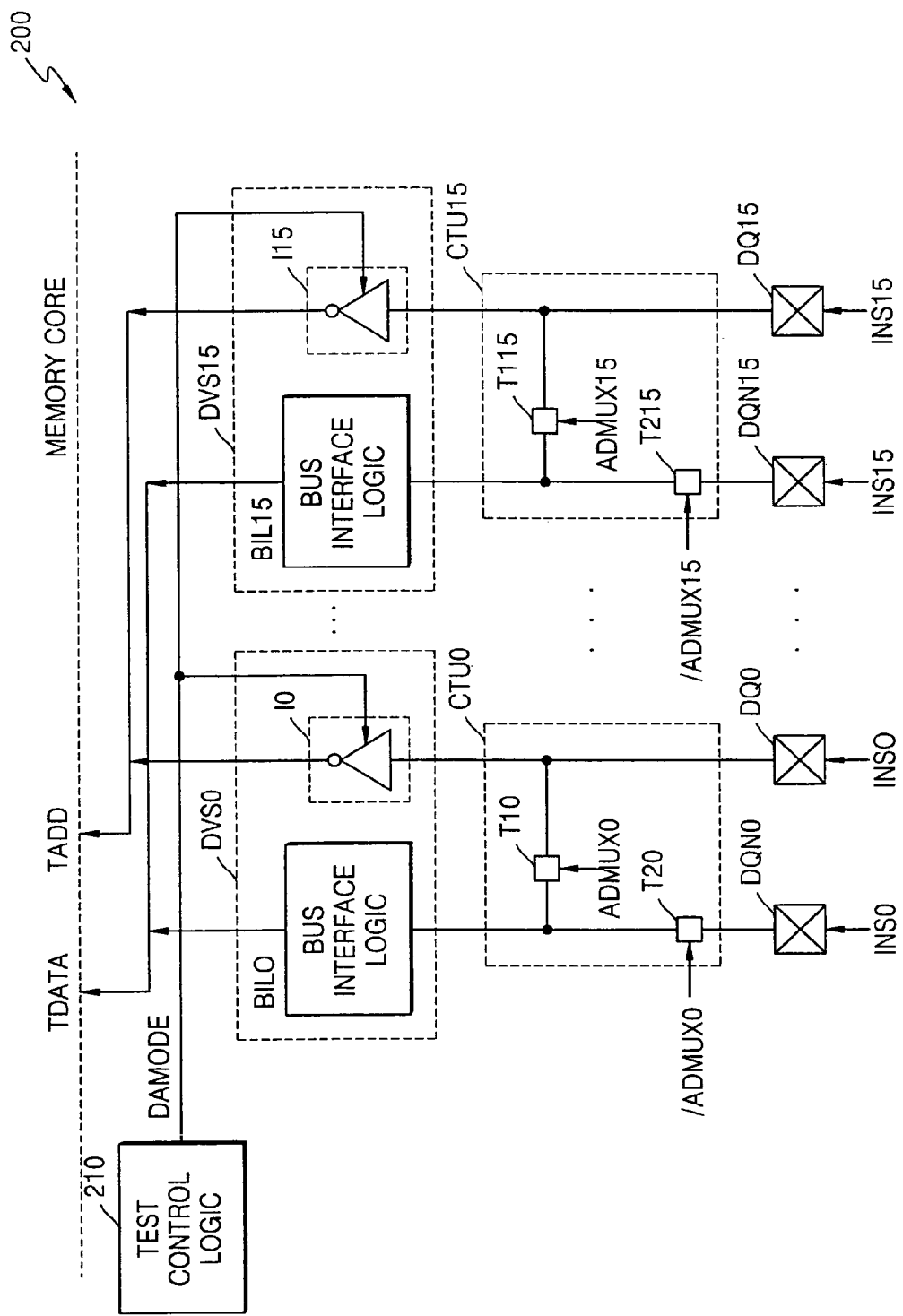
FIG. 2 is a block diagram illustrating a memory device, according to embodiments of the present invention.

Example FIG. 2 is a block diagram illustrating a memory device according to embodiments of the present invention. A memory device 200, according to embodiments of the present invention, includes input pins DQ0 through DQ15 and inverting input pins DQN0 through DQN15. The memory device 200 also includes control units CTU0 through CTU15 and separation units DVS0 through DVS15, which corresponds to the input pins DQ0 through DQ15.

The control units CTU0 through CTU15 respond to control signals ADMUX0 through ADMUX15 and either transmit or block input signals INS0 through INS15 applied to input pins DQ0 through DQ15 and/or inverting input pins DQN0 through DQN15. The separation units DVS0 through DVS15 receive input signals INS0 through INS15 that are output from the control units CTU0 through CTU15 in response to a mode signal. The separation units DVS0 through DVS1 5 separate data TDATA and an address TADD from the input signals INS0 through INS15 and apply the separated data TDATA and address TADD to a memory core.

Referring to FIGS. 1 and 2, a method 100 controls input signals of a memory device according to the test modes. In Step 110, it is determined whether a memory device 200 is in a first test mode or a second test mode. If the memory device 200 is in the first test mode, the memory device 200 may be in a wafer test stage. If the memory device 200 is in the second test mode, the memory device 200 may be in either a monitor burn-in test (MBT) or a package test stage. For each type of test stage, the method by which the memory device 200 receives input signals INS0 and INS15 may be different.

If the memory device 200 is in the first test mode, in response to the control signal, the input signal INS0 (for example) is received through the input pins (Step 120). In response to a mode signal, the input signal INS0 is separated into data and an address (Step 130). The separated data and address are applied to the memory core (Step 160).

The memory device 200 may have a structure where input pins DQ0 through DQ15 and inverting input pins DQN0 through DQN15 form pairs. When the memory device 200 is in the first test mode, the memory device 200 receives the input signal INS0 through the input pin DQ0. No input signal INS0 is received through the inverting input pin DQN0. The received input signal INS0 is applied to a control unit CTU0. The control unit CTU0 includes a first transmission unit 1i0 and a second transmission unit T20. The first transmission unit T10 and the second transmission unit T20 may be a switch or a transmission gate. The first transmission unit T10 responds to a control signal ADMUX0 and either connects or disconnects a bus interface logic BIL0 of a separation unit DVS0 and the input pin DQ0. The second transmission unit T20 responds to an inverting control signal/ADMUX0 and either connects or disconnects the bus interface logic BIL0 and the inverting input pin DQN0. The input pin DQ0 and address separation unit 10 of the separation unit DVS0 are connected.

The control signal ADMUX0 may be a mode register set (MRS) signal. In the first test mode, the control signal ADMUX0 may be produced at a first level. If the control signal ADMUX0 is at the first level, the first transmission unit T10 connects the input pin DQ0 and the bus interface logic BIL0. If the control signal ADMUX0 is at the first level, then the inverting control signal /ADMUX0 is at a second level. If the inverting control signal /ADMUX0 is at the second level, the second transmission unit T20 is blocked. Thus, the input signal INS0 (received through the input pin DQ0) is applied to the bus interface logic BIL0 and the address separation unit 10.

The separation unit DVS0 includes a bus interface logic BIL0 and address separation unit 10. The bus interface logic BIL0 separates data TDATA from the input signal INS0 and applies it to the memory core. The address separation unit 10 responds to all mode signals DAMODE and separates an address TADD from the input signal INS0. When the mode signal DAMODE is activated, data TDATA is separated from the input signal INS0 at the bus interface logic BIL0 and is applied to the memory core. When the mode signal DAMODE is deactivated, the address TADD is separated from the input signal INS0 at the address separation unit 10 and is applied to the memory core.

The memory device 200 may include a test control logic 210 that produces the mode signal DAMODE. The test control logic 210 produces the mode signal DAMODE to separate the data TDATA and the address TADD and is controlled by a command.

Figure 3A:
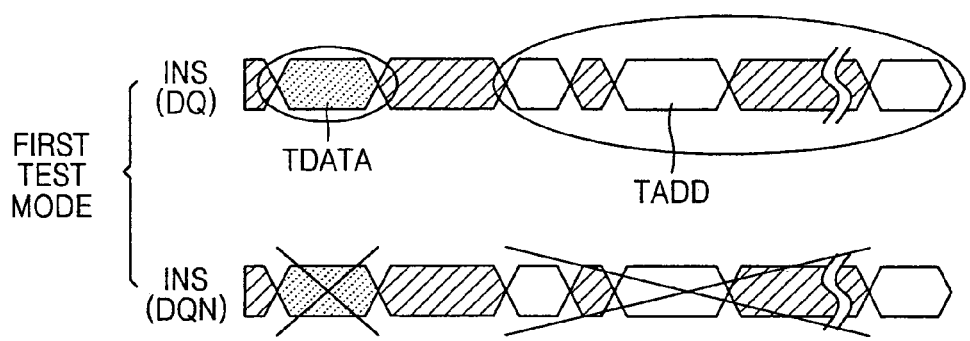
FIG. 3A illustrates example input signals received through input pins in a first test mode.

Example FIG. 3A illustrates input signals received through input pins in a first test mode (for example). The input signal INS0 is applied to the input pin DQ0 (e.g. single-ended signaling) and not applied to the inverting input pin DQN0 (for example). The input signal INS0 with data TDATA and an address TADD is applied to the input pin DQ0. At the separation unit DVS0, the input signal INS0 is separated into the data TDATA and the address TADD, which are applied to the memory core.

If the memory device is in a second test mode (e.g. differential signaling), in response to the control signal, the input signal INS0 is received through the input pins and the inverting input pins (Step 140). In response to the mode signal, the address is separated from the input signal received through the input pins and the data is separated from the input signal received through the inverting input pins (Step 150). The separated data and address are applied to the memory core (Step 160). When the memory device is in the second test mode, the memory device 200 receives similar input signals INS0 (with opposite phases) through the input pin DQ0 and the inverting input pin DQN0. The received input signal INS0 is applied to the control unit CTU0.

A control signal ADMUX0 is at a second level in the second test mode. If the control signal ADMUX0 is at the second level, the first transmission unit TI 0 disconnects the input pin DQ0 and the bus interface logic BIL0. If the control signal ADMUX0 is at the second level, the inverting control signal /ADMUX is at the first level. When the inverting control signal /ADMUX0 is at the first level, the second transmission unit T20 connects the inverting input pin DQN0 and the bus interface logic BIL0.

The input signal INS0 (received through the input pin DQ0) is applied to the address separation unit 10. The input signal INS0 (received through the inverting input pin DQN0) is applied to the bus interface logic BIL0. The bus interface logic BIL0 separates the data TDATA from the input signal INS0 and applies the separated data TDATA to the memory core. The address separation unit 10 responds to the mode signal DAMODE and separates the address TADD from the input signal INS0 and applies the separated address TADD to the memory core.

When the mode signal DAMODE is activated, the data TDATA is separated from the input signal INS0 at the bus interface logic BIL0 and is applied to the memory core. When the mode signal DAMODE is deactivated, the address TADD is separated from the address separation unit 10 and is applied to the memory core.

Figure 3B:
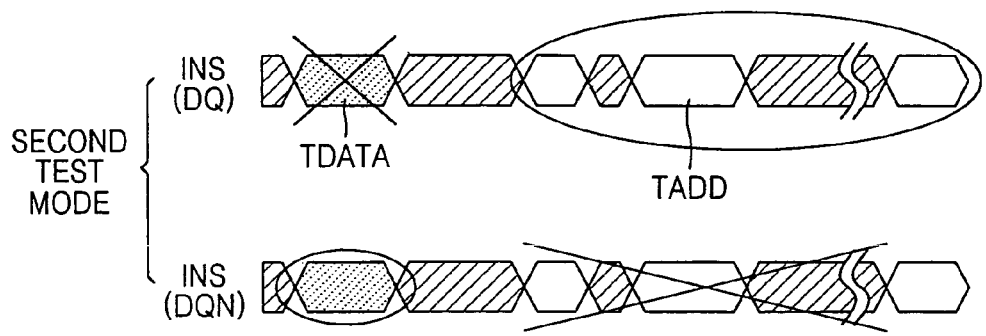
FIG. 3B illustrates example input signals received through input pins and inverting input pins in a second test mode.

Example FIG. 3B is a view showing input signals received through input pins and inverting input pins in a second test mode. Referring to FIG. 3B, only the address TADD of the input signal INS0 that is applied to the input pin DQ0 is applied to the memory core. Only the data TDATA of the input signal INS0 that is applied to the inverting input pin DQN0 is applied to the memory core.

According to embodiments of the present invention, the memory device 200 and the method 100 of controlling input signals have the advantage of selecting either to receive data or an address separately, according to test modes or to receive data and an address through one pin. In other words, in a wafer test stage of a memory device 200, data and an address of an input signal INS0 are received through one pin and separated afterwards. In a MBT stage or a package test stage, an input signal INS0 is received through two pins which separates data and an address. Such operations can be selectively performed.

Figure 4A:
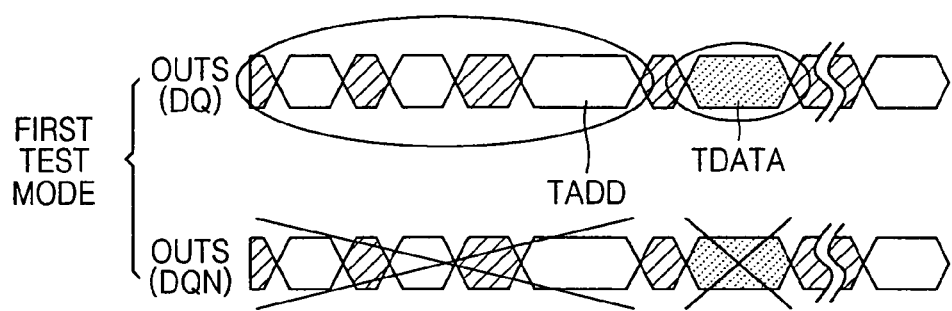
FIG. 4A illustrates example data and an address output from output pins in the first test mode.
Figure 4B:
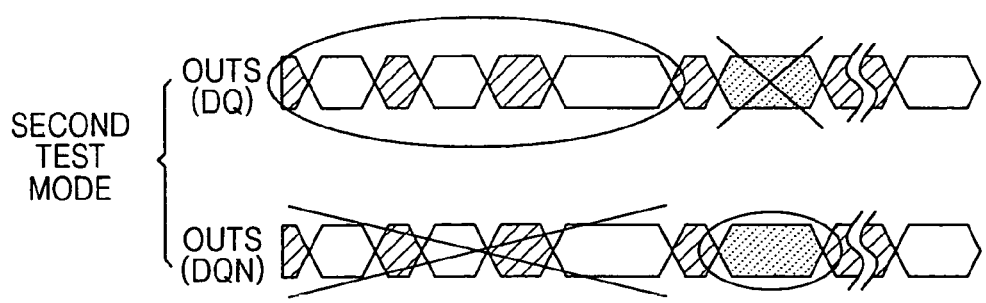
FIG. 4B illustrates example data and an address output from output pins and inverting output pins in the second test mode.

Example FIG. 4A is a view illustrating data and an address output from output pins in a first test mode. Example FIG. 4B is a drawing illustrating data and an address output from output pins and inverting output pins in a second test mode. When data and an address (saved in a memory core) are output, output pins may be selectively selected according to test modes. Referring to FIG. 4A, in the first test mode, the data and the address are output from only the output pin. Referring to FIG. 4B, in the second test mode, the address is output through the output pin and the data is output through an inverting output pin.

Figure 5:
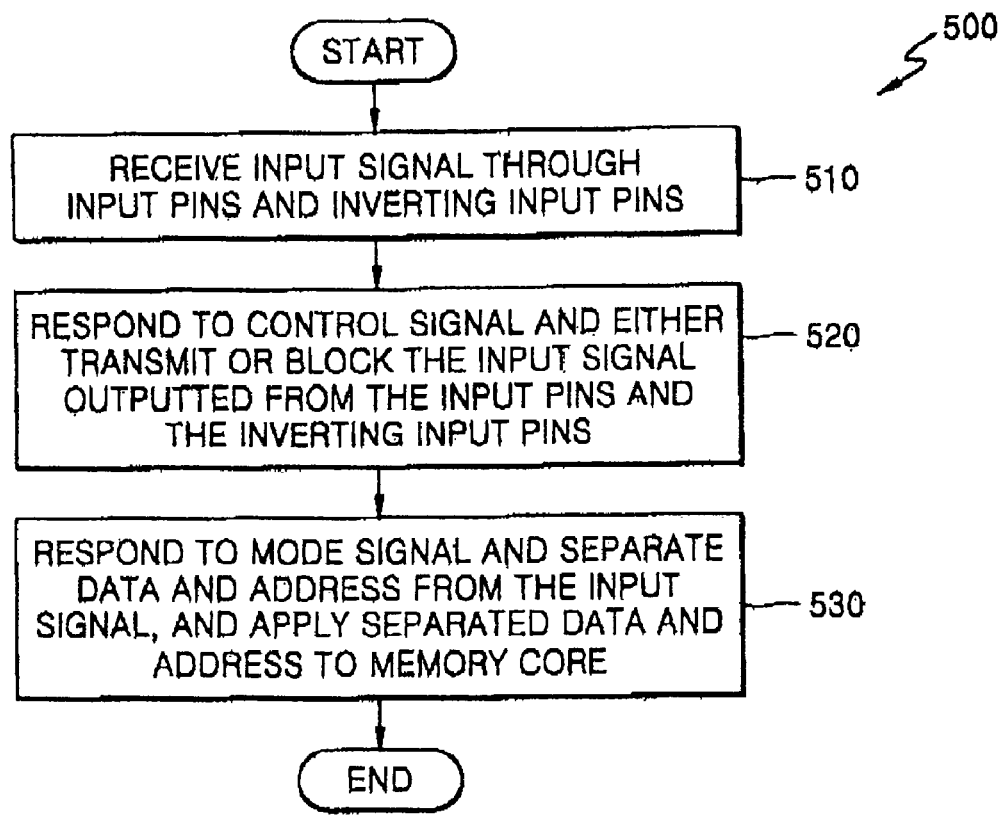
FIG. 5 is a flow chart illustrating a method of controlling an input signal of a memory device for each test mode, according to embodiments of the present invention.

Example FIG. 5 is a flow chart illustrating a method of controlling an input signal of a memory device for each test mode, according to embodiments of the present invention. Referring to FIG. 5, method 500 controls input signals of a memory device. Input signals are received through input pins and inverting input pins (Step 510).

The input signal control method 100 of FIG. 1 either receives the input signal INS0 through the input pins for each of the test modes or receives the input signal INS0 through the input pins and the inverting input pins. However, the input control signal method 500 of FIG. 5 receives the input signal through the input pins and inverting input pins first. In response to the control signal, the input signal output from the input pins and the inverting input pins is either transmitted or blocked (Step 520).

If the control signal is at a first level, the input signal output from the inverting input pin is blocked and the input signal output from the input pin is transmitted. In a wafer test stage, the control signal may be at a first level. If the control signal is at a second level, all the input signals output from the input pin and the inverting input pin are transmitted. In a MBT stage or a package test stage, the control signal may be at a second level. For each of the test modes, the level of a control signal is controlled and input signals received through input pins or inverting input pins are either transmitted or blocked according to the level of the control signal.

In response to a mode signal, the data and the address from the input signal are separated. The separated data and address are applied to the memory core (Step 530). Step 530 responds to the mode signal and separates data and an address from the input signal. At Step 530, if the control signal is at a first level (e.g. at a wafer test stage), the data and the address (from the input signal) are output from the input pin are separated, in response to the mode signal.

If the control signal is a second level (e.g. at a MBT stage or a package test stage), the address from the input signal output from the input pin is separated and the data from the input signal output through the inverting input pin is separated, in response to the mode signal. When the mode signal is activated, the data is separated from the input signal and when the mode signal is deactivated, the address is separated from the input signal.

The input signal control method 500 of FIG. 5 differs from the input signal control method of 100 of FIG. 1, as the input signal of method 500 is received through the input pin and the inverting input pin first. However, the separation protocols (after receiving the input signal) is similar in both method 100 and method 500.

A method of controlling input signals and a memory device, according to embodiments of the present invention, as described above, has the advantage of selecting whether to receive data or an address together or separately, for each test mode, since a memory device adopting a differential signaling technology has twice as many input/output pins. Consequently, conventional low price test equipment that operates at a low frequency can be used which saves investment in equipment. Also, since the memory device can be fully tested at each stage of the test, the test efficiency is improved.

The attached drawings illustrate embodiments of the present invention and are referred to in order to gain a sufficient understanding, the merits, and objectives of embodiments of the present invention. While embodiments of the present invention have been particularly shown and described with reference to example embodiments thereof, it will be understood by those of ordinary skill in the art that various changes in form and details may be made therein without departing from the spirit and scope of the embodiments of the present invention as defined by the following claims.

What is claimed is:

1. A method of controlling an input signal of a memory device according to a test mode, the method comprising:
   determining whether the memory device is in a first test mode or in a second test mode;
   receiving the input signal through an input pin, in response to a control signal, when the memory device is in a first test mode;
   separating the input signal received through the input pin into a data component and an address component in response to a mode signal when the memory device is in a first test mode;
   receiving the input signal through the input pin and an inverting input pin, in response to the control signal, when the memory device is in a second test mode;
   separating the address component from the input signal received through the input pin and separating the data component from the input signal received through the inverting input pin, in response to the mode signal, when the memory device is in a second test mode; and,
   applying the separated data component and address component to the memory core.

2. The method of claim 1, wherein separating the input signal received through the input pin into the data component and the address component in response to a mode signal when the memory device is in the first test mode comprises:
   separating the data component from the input signal while the mode signal is activated; and,
   separating the address component from the input signal while the mode signal is deactivated.

3. The method of claim 1, wherein separating the address component from the input signal received through the input pin and separating the data component from the input signal received through the inverting input pin, in response to a mode signal, when the memory device is in the second test mode comprises:
   separating the data component from the input signal received through the inverting input pin while the mode signal is activated; and,
   separating the address component from the input signal received through the input pin while the mode signal is deactivated.

4. The method of claim 1, wherein the control signal is produced at a first and second level in a first and second test mode, respectively.

5. The method of claim 1, wherein the control signal is a mode register set signal.

6. The method of claim 1, wherein the first test mode is a wafer test stage.

7. The method of claim 1, wherein the second test mode is a monitor burn-in test stage or a package test stage.

8. The method of claim 1, wherein the input pin and the inverting input pin of the memory device form a pair.

9. A memory device that controls an input signal according to a test mode, the memory device comprising:
   input pins and corresponding inverting input pins;
   a control unit that transmits the input signal applied to at least one of one of the input pins and one of the inverting input pins, wherein, when the input signal is applied to the one of the inverting input pins, the control unit receives the input signal from the one of the inverting input pins, blocks the input signal received from the one of the inverting input pins when a control signal indicates a first level, and transmits the input signal received from the one of the inverting input pins when the control signal indicates a second level; and
   a separation unit that receives the input signal output from the control unit, wherein the separation unit comprises:
      a bus interface logic that separates a data component from the input signal and applies the data component to the memory core; and
      an address separation unit that responds to a mode signal, separates an address component from the input signal, and applies the address component to the memory core.

10. The memory device of claim 9, wherein the separation unit separates the data component from the input signal while the mode signal is activated and separates the address component from the input signal while the mode signal is deactivated.

11. The memory device of claim 10, wherein the control unit comprises:
    a first transmission unit that responds to the control signal and either connects or disconnects the one of the input pins and the bus interface logic; and
    a second transmission unit that responds to an inverting control signal and either connects or disconnects the one of the inverting input pins and the bus interface logic,
    wherein the one of the input pins and the address separation unit are connected.

12. The memory device of claim 11, wherein:
    the first transmission unit connects the one of the input pins and the bus interface logic when the control signal is at a first level; and
    the second transmission unit connects the one of the inverting input pins and the bus interface logic when the inverting control signal is at a second level.

13. The memory device of claim 11, wherein the first transmission unit and the second transmission unit are one of a switch and a transmission gate.

14. The memory device of claim 11, wherein the control signal is a mode register set signal.

15. The memory device of claim 11, wherein the control signal is produced at a first level in a wafer test stage.

16. The memory device of claim 11, wherein the control signal is produced at a second level in at least one of a monitor burn-in test stage and a package test stage.

17. The memory device of amended claim 9, wherein the one of the input pins and the one of the inverting input pins form a pair.

18. The memory device of amended claim 9, further comprising a test control logic that produces the mode signal.

19. A method of controlling an input signal according to test modes, the method comprising:
    providing an input signal to a control unit through an input pin and an inverting input pin;
    transmitting the input signal provided through the input pin;
    blocking the input signal provided through the inverting input pin when a control signal indicates a first level;

transmitting the input signal provided through the inverting input pin when the control signal indicates a second level;
separating a data component from the input signal using a bus interface logic of a separation unit;
separating an address component from the input signal using an address separation unit of the separation unit, wherein the address separation unit responds to a mode signal; and,
applying the data component and the address component to a memory core.

20. The method of claim 19, comprising:
separating the data component and the address component from the input signal provided through the input pin, in response to the mode signal, when the control signal is at a first level; and
separating the address component from the input signal output from the input pin and separating the data component from the input signal provided through the inverting input pin, in response to the mode signal, when the control signal is at a second level.

21. The method of claim 19, wherein the control signal is a mode register set signal.

22. The method of claim 19, wherein the control signal is at a first level in a wafer test stage and is at a second level in at least one of a monitor burn-in test stage and a package test stage.

23. The method of claim 19, wherein the input pin and the inverting input pin of the memory device form a pair.

24. The method of claim 19, wherein separating the data component and the address component from the input signal comprises separating the data component from the input signal when the mode signal is activated and separating the address component from the input signal when the mode signal is deactivated.

* * * * *